(12) United States Patent
Pei et al.

(10) Patent No.: US 11,933,858 B2
(45) Date of Patent: Mar. 19, 2024

(54) METHOD AND APPARATUS FOR SIMULTANEOUS DETECTION OF A PLURALITY OF PARAMETERS OF A PLURALITY OF MEMBRANE ELECTRODE ASSEMBLIES OF FUEL CELL STACK

(71) Applicant: TSINGHUA UNIVERSITY, Beijing (CN)

(72) Inventors: Pucheng Pei, Beijing (CN); Peng Ren, Beijing (CN); Dongfang Chen, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 249 days.

(21) Appl. No.: 17/227,379

(22) Filed: Apr. 12, 2021

(65) Prior Publication Data
US 2022/0244319 A1    Aug. 4, 2022

Related U.S. Application Data

(63) Continuation of application No. PCT/CN2021/076745, filed on Feb. 18, 2021.

(30) Foreign Application Priority Data

Feb. 2, 2021  (CN) .......................... 202110144753.X

(51) Int. Cl.
*G01R 31/396* (2019.01)
*G01R 31/382* (2019.01)
(Continued)

(52) U.S. Cl.
CPC ......... *G01R 31/396* (2019.01); *G01R 31/382* (2019.01); *H01M 8/04552* (2013.01);
(Continued)

(58) Field of Classification Search
CPC .................................................... G01R 31/396
See application file for complete search history.

(56) References Cited

U.S. PATENT DOCUMENTS

2012/0276466 A1* 11/2012 Sinha ................ H01M 8/04582
429/430

FOREIGN PATENT DOCUMENTS

| CN | 102981124 A | 3/2013 |
|---|---|---|
| CN | 109799465 A | 5/2019 |
| CN | 111525158 A | 8/2020 |

OTHER PUBLICATIONS

Pei et al., "Improved method to measure hydrogen crossover current in proton exchange membrane fuel cell," Applied Energy, (2018).*
(Continued)

*Primary Examiner* — Hyun D Park

(57) ABSTRACT

Provided is a method for simultaneous detection of parameters of membrane electrode assemblies of a fuel cell stack, which includes: supplying hydrogen to an anode of the fuel cell stack and inert gas to a cathode of the fuel cell stack, controlling operating conditions of the fuel cell stack at respective preset values; applying different voltage excitations or micro-current excitations to the fuel cell stack, collecting a current signal of an entire stack and a voltage signal of each fuel cell; and analyzing a hydrogen crossover current, a catalyst electrochemical surface area, a double-layer capacitance, and a short-circuit resistance of a membrane electrode assembly of each fuel cell based on an excitation-response formula of a fuel cell. The present disclosure does not limit a form of a current or voltage excitation, thereby improving accuracy of a parameter test of a membrane electrode assembly while reducing the test cost.

9 Claims, 4 Drawing Sheets

(51) Int. Cl.
*H01M 8/04537* (2016.01)
*H01M 8/04701* (2016.01)
*H01M 8/04746* (2016.01)
*H01M 8/04828* (2016.01)
*H01M 8/1004* (2016.01)

(52) U.S. Cl.
CPC ... *H01M 8/04589* (2013.01); *H01M 8/04641* (2013.01); *H01M 8/04701* (2013.01); *H01M 8/04753* (2013.01); *H01M 8/04828* (2013.01); *H01M 8/1004* (2013.01)

(56) References Cited

OTHER PUBLICATIONS

Chiprut et al., "Maximin optimization for binary regression", J of Latex Class Files, (2020).*
Pucheng Pei et al., "Use of galvanostatic charge method as a membrane electrode assembly diagnostic tool in a fuel cell stack", Journal of Power Sources, 245 (2014), pp. 175-182, available online Jun. 14, 2013.
Xaioning Jia, "Research on the Relationship between Fuel Cell Performance and MEA Parameters and Lifetime Prediction Based on the Attenuation Law", China Master's Theses Full-text Database, Jun. 15, 2020, pp. 18-27.
The First Office Action in counterpart Chinese Application No. 202110144753.X, dated Dec. 1, 2021.

* cited by examiner

METHOD AND APPARATUS FOR SIMULTANEOUS DETECTION OF A PLURALITY OF PARAMETERS OF A PLURALITY OF MEMBRANE ELECTRODE ASSEMBLIES OF FUEL CELL STACK

CROSS-REFERENCE TO RELATED APPLICATION

The present disclosure is a continuation of International Application No. PCT/CN2021/076745, filed on Feb. 18, 2021, which claims priority to Chinese Patent Application No. 202110144753.X, titled "METHOD AND APPARATUS FOR SIMULTANEOUS DETECTION OF A PLURALITY OF PARAMETERS OF A PLURALITY OF MEMBRANE ELECTRODE ASSEMBLIES OF FUEL CELL STACK" and filed on Feb. 2, 2021, both of which are hereby incorporated by reference in their entireties.

TECHNICAL FIELD

The present disclosure relates to the field of fuel cell technologies, and more particularly, to a method and apparatus for simultaneous detection of a plurality of parameters of a plurality of membrane electrode assemblies of a fuel cell stack.

BACKGROUND

A proton exchange membrane fuel cell is an ideal vehicle-mounted power source and has received widespread attention. With a gradual increase in power requirements of a fuel cell stack, membrane electrode assemblies in a single fuel cell stack have increased to hundreds of membrane electrode assemblies. An impact of membrane electrode assembly consistency on the performance and durability of the stack has become more prominent.

Batch testing and parameter evaluation of membrane electrode assembly are crucial for consistency screening. Conventionally, parameters for evaluating the quality of membrane electrode assemblies generally include a catalyst electrochemical surface area and a hydrogen crossover current. Conventional electrochemical testing methods generally can only test single fuel cell. For example, cyclic voltammetry can only test the catalyst electrochemical surface area of a single fuel cell membrane electrode assembly. Linear sweep voltammetry can only test the hydrogen crossover current of a single fuel cell membrane electrode assembly. In recent years, a galvanostatic charging analytical method for simultaneously testing parameters of a plurality of membrane electrode assemblies in a stack has been developed, but strict high-precision constant current and high-frequency voltage sampling are required. An analytical model is incomplete, leading to inherent errors in parameter analysis. An analysis process is complicated and easily leads to error transmission. Therefore, existing methods for detecting a plurality of parameters of membrane electrode assemblies have high requirements on devices, but the stability of measurement and analysis results is poor.

SUMMARY

The present disclosure aims to solve at least one of the technical problems in the related art to some extent.

To this end, a first objective of the present disclosure is to provide a method for simultaneous detection of a plurality of parameters of a plurality of membrane electrode assemblies of a fuel cell stack, capable of overcoming various defects in existing methods. Also, the method does not limit the form of a current or voltage excitation, and has low requirements on a voltage sampling frequency. An analytical model is complete and an analytical process is highly stable. Consequently, an accuracy of a parameter test of a membrane electrode assembly is greatly improved.

A second objective of the present disclosure is to provide an apparatus for simultaneous detection of a plurality of parameters of a plurality of membrane electrode assemblies of a fuel cell stack.

To achieve the above objectives, according to an embodiment in a first aspect of the present disclosure, a method for simultaneous detection of a plurality of parameters of a plurality of membrane electrode assemblies of a fuel cell stack is provided. The method includes:

supplying hydrogen to an anode of the fuel cell stack and inert gas to a cathode of the fuel cell stack, controlling a temperature, gas flow, gas back pressure, and gas humidity of the fuel cell stack to be maintained at respective preset values correspondingly, and controlling each fuel cell in the fuel cell stack to be maintained at a stable concentration potential;

applying a plurality of different voltage excitations or micro-current excitations to the fuel cell stack, and collecting a current signal of an entire stack and a voltage signal of each fuel cell, a starting point of an application of each excitation being recorded as time zero, and the stable concentration potential of each fuel cell being recorded as a starting voltage of each fuel cell; and analyzing a hydrogen crossover current density, a catalyst electrochemical surface area, a double-layer capacitance, and a short-circuit resistance of a membrane electrode assembly of each fuel cell based on an excitation-response formula of a fuel cell, the excitation-response formula of the fuel cell being:

$$\frac{\int_0^t i_{ch} dt}{t} = i_H + Q_{Cata.} \frac{1}{t} + C_{dl} \frac{U - U_0}{t} + \frac{1}{R_e} \cdot \frac{\int_0^t U dt}{t}, \quad \text{Formula (1)}$$

where $i_{ch}$ represents a real-time excitation current density, or a real-time response current density under a voltage excitation, $i_H$ represents a hydrogen crossover current density, $Q_{Cata.}$ represents a real-time total amount of charges absorbed and desorbed on a surface of a catalyst, $C_{dl}$ represents the double-layer capacitance, U represents a real-time voltage of a single cell, $U_0$ represents a starting voltage of the single cell of a single excitation, $R_e$ represents the short-circuit resistance, and t represents time.

With the method for simultaneous detection of a plurality of parameters of a plurality of membrane electrode assemblies of a fuel cell stack, hydrogen is supplied to an anode of a fuel cell stack and inert gas is supplied to a cathode of the fuel cell stack. A temperature, gas flow, gas back pressure, and gas humidity of the fuel cell stack are controlled to be maintained at respective preset values correspondingly. Each fuel cell in the fuel cell stack is controlled to be maintained at a stable concentration potential. A plurality of different voltage excitations or micro-current excitations are applied to the fuel cell stack. A current signal of an entire stack and a voltage signal of each fuel cell are collected. A starting point of an application of each excitation is recorded as time zero, and the stable concentration potential of each fuel cell is recorded as a starting voltage of each fuel cell. A hydrogen crossover current, a catalyst electrochemical surface area, a double-layer capacitance, and a short-circuit resistance of a membrane electrode assembly of each fuel cell are analyzed based on an excitation-response formula of a fuel cell. The present disclosure does not limit the form of a current or voltage excitation, and has low requirements on a voltage sampling frequency. An analytical model is complete and an analytical process is highly stable. Consequently, accuracy and precision of a parameter test of a membrane electrode assembly are greatly improved, and the cost of a test device may also be greatly reduced.

Optionally, in an embodiment of the present disclosure, the inert gas includes, but not limited to, one of nitrogen, helium, and argon. If the cathode is supplied with air, it is necessary to discharge oxygen completely under a blind end or a gas circulation condition of the cathode, thereby providing an inert gas environment for the cathode.

Optionally, in an embodiment of the present disclosure, each of the plurality of voltage excitations is controlled as increasing a stack voltage of the fuel cell stack from a stable value to a limit value, the limit value of the stack voltage being determined based on a single fuel cell having a highest response voltage, and a response voltage being smaller than a safe voltage threshold.

Optionally, in an embodiment of the present disclosure, each of the plurality of micro-current excitations includes a constant current excitation and a non-constant current excitation;

an end point of an excitation application of each of the plurality of micro-current excitations is determined based on a single fuel cell having a highest response voltage, a response voltage being smaller than a safe voltage threshold; and when a high-precision power supply is used for an excitation at a programming current, the programming current is determined as an actually-measured current of the entire stack.

Optionally, in an embodiment of the present disclosure, the plurality of different voltage excitations or micro-current excitations are different in increase rates of excitation voltages or values of excitation currents.

Optionally, in an embodiment of the present disclosure, in a process of performing a plurality of excitations, the plurality of excitations are performed at a preset time interval, the preset time interval being determined based on that a voltage of each fuel cell falls to the concentration potential and is maintained for preset time after a previous excitation.

Optionally, in an embodiment of the present disclosure, when the short-circuit resistance is greater than a preset resistance value, or when an influence of the short-circuit resistance is ignored for simplification processing, the excitation-response formula of the fuel cell is converted into:

$$\frac{\int_0^t i_{ch} dt}{t} = i_H + Q_{Cata.} \frac{1}{t} + C_{dl} \frac{U - U_0}{t}, \quad \text{Formula (2)}$$

where $i_{ch}$ represents the real-time excitation current density, or the real-time response current density under the voltage excitation, $i_H$ represents the hydrogen crossover current density, $Q_{Cata.}$ represents the real-time total amount of charges absorbed and desorbed on the surface of the catalyst, $C_{dl}$ represents the double-layer capacitance, U represents the real-time voltage of the single cell, $U_0$ represents the starting voltage of the single cell of the single excitation, and t represents the time.

Optionally, in an embodiment of the present disclosure, data of each single fuel cell is analyzed separately, a voltage window of an initial analysis is set to $[U_1, U_2]$, the voltage window corresponding to a voltage interval after a completion of hydrogen desorption and before a start of oxygen adsorption, all data in a range of the voltage window is processed, and it is set that:

$$Y = \frac{\int_0^t i_{ch} dt}{t}, \quad X_1 = \frac{1}{t}, \quad X_2 = \frac{U - U_0}{t}, \quad X_3 = \frac{\int_0^t U dt}{t} \quad (3)$$

when the formula (1) is used for an analysis, ternary linear regression is performed based on $Y = a_0 + a_1 X_1 + a_2 X_2 + a_3 X_3$ to obtain coefficients of respective terms, and to obtain the plurality of parameters of a fuel cell membrane electrode assembly:

$$i_H = a_0, \quad Q_{Cata.-H} = a_1, \quad C_{dl} = a_2, \quad R_e = \frac{1}{a_3} \quad (4)$$

when the formula (2) is used for an analysis, binary linear regression is performed based on $Y = a_0 + a_1 X_1 + a_2 X_2$ to obtain the plurality of parameters of a membrane electrode assembly:

$$i_H = a_0, \quad Q_{Cata.-H} = a_1, \quad C_{dl} = a_2 \quad (5), \text{ and}$$

where $Q_{Cata.-H}$ represents a total amount of charges of hydrogen desorption, and the catalyst electrochemical surface area is analyzed by the total amount of charges of hydrogen desorption:

$$ECSA = \frac{Q_{Cata.-H}}{\Gamma_{Cata.} \times L_{Cata.}}, \quad (6)$$

where ECSA represents the catalyst electrochemical surface area, $\Gamma_{Cata.}$ represents an amount of charges required to cover the surface of the catalyst completely with a single layer of adsorption hydrogen, and $L_{Cata.}$ represents catalyst loading of a measured electrode.

Optionally, in an embodiment of the present disclosure, the method further includes:

when the formula (1) is used for an analysis, solving the real-time total amount of charges absorbed and desorbed on the surface of the catalyst in a full voltage range under all excitation conditions reversely:

$$Q_{Cata.} = \int_0^t i_{ch} dt - i_H t - C_{dl}(U - U_0) - \frac{\int_0^t U dt}{R_e} \quad (7)$$

when the formula (2) is used for an analysis, solving the real-time total amount of charges absorbed and desorbed on the surface of the catalyst in the full voltage range under all excitation conditions reversely:

$$Q_{Cata.} = \int_0^t i_{ch} dt - i_H t - C_{dl}(U - U_0) \quad (8), \text{ and}$$

checking whether $Q_{Cata.}$ meets a preset condition in the voltage window $[U_1, U_2]$, if not, adjusting the voltage window and repeating the analysis until the preset condition is met, the preset condition being that a standard deviation of all data of $Q_{Cata.}$ in the voltage window is smaller than a limit value.

To achieve the above objectives, according to an embodiment in a second aspect of the present disclosure, an apparatus for simultaneous detection of a plurality of parameters of a plurality of membrane electrode assemblies of a fuel cell stack is provided. The apparatus includes:

a setting module, configured to supply hydrogen to an anode of a fuel cell stack and inert gas to a cathode of the fuel cell stack, to control a temperature, gas flow, gas back pressure, and gas humidity of the fuel cell stack to be maintained at respective preset values correspondingly, and to control each fuel cell in the fuel cell stack to be maintained at a stable concentration potential;

a control module, configured to apply a plurality of different voltage excitations or micro-current excitations to the fuel cell stack, and to collect a current signal of an entire stack and a voltage signal of each fuel cell, a starting point of an application of each excitation being recorded as time zero, and the concentration potential of each fuel cell being recorded as a starting voltage of each fuel cell; and an analysis module, configured to analyze a hydrogen crossover current, a catalyst electrochemical surface area, a double-layer capacitance, and a short-circuit resistance of a membrane electrode assembly of each fuel cell based on an excitation-response formula of a fuel cell, the excitation-response formula of the fuel cell being:

$$\frac{\int_0^t i_{ch} dt}{t} = i_H + Q_{Cata.} \frac{1}{t} + C_{dl} \frac{U - U_0}{t} + \frac{1}{R_e} \cdot \frac{\int_0^t U dt}{t}, \quad \text{Formula (1)}$$

where $i_{ch}$ represents a real-time excitation current density, or a real-time response current density under a voltage excitation, $i_H$ represents a hydrogen crossover current density, $Q_{Cata.}$ represents a real-time total amount of charges absorbed and desorbed on a surface of a catalyst, $C_{dl}$ represents the double-layer capacitance, U represents a real-time voltage of a single cell, $U_0$ represents a starting voltage of the single cell of a single excitation, $R_e$ represents the short-circuit resistance, and t represents time.

With the apparatus for simultaneous detection of a plurality of parameters of a plurality of membrane electrode assemblies of a fuel cell stack, hydrogen is supplied to an anode of a fuel cell stack and inert gas is supplied to a cathode of the fuel cell stack. A temperature, gas flow, gas back pressure, and gas humidity of the fuel cell stack are controlled to be maintained at respective preset values correspondingly. Each fuel cell in the fuel cell stack is controlled to be maintained at a stable concentration potential. A plurality of different voltage excitations or micro-current excitations are applied to the fuel cell stack. A current signal of an entire stack and a voltage signal of each fuel cell are collected. A starting point of an application of each excitation is recorded as time zero, and the stable concentration potential of each fuel cell is recorded as a starting voltage of each fuel cell. A hydrogen crossover current, a catalyst electrochemical surface area, a double-layer capacitance, and a short-circuit resistance of a membrane electrode assembly of each fuel cell are analyzed based on an excitation-response formula of a fuel cell. The present disclosure does not limit the form of a current or voltage excitation, and has low requirements on a voltage sampling frequency. An analytical model is complete and an analytical process is highly stable. Consequently, accuracy and precision of a parameter test of a membrane electrode assembly are greatly improved, and the cost of a test device may also be greatly reduced.

Optionally, in an embodiment of the present disclosure, the apparatus further includes:

the control module, configured to control each of the plurality of voltage excitations as increasing a stack voltage of the fuel cell stack from a stable value to a limit value, the limit value of the stack voltage being determined based on a single fuel cell having a highest response voltage, and a response voltage being smaller than a safe voltage threshold; and each of the plurality of micro-current excitations includes a constant current excitation and a non-constant current excitation, a determination module, configured to determine an end point of an excitation application of each of the plurality of micro-current excitations based on a single fuel cell having a highest response voltage, a response voltage being smaller than a safe voltage threshold; wherein when a high-precision power supply is used for an excitation at a programming current, the programming current is determined as an actually-measured current of the entire stack.

Optionally, in an embodiment of the present disclosure, the apparatus further includes an excitation module, configured to perform, in a process of performing a plurality of excitations, the plurality of excitations at a preset time interval, the preset time interval being determined based on that a voltage of each fuel cell falls to the concentration potential and is maintained for preset time after a previous excitation.

Optionally, in an embodiment of the present disclosure, the apparatus further includes:

when the short-circuit resistance is greater than a preset resistance value, or when an influence of the short-circuit resistance is ignored for simplification processing, converting the excitation-response formula of the fuel cell into:

$$\frac{\int_0^t i_{ch} dt}{t} = i_H + Q_{Cata.} \frac{1}{t} + C_{dl} \frac{U - U_0}{t}, \quad \text{Formula (2)}$$

where $i_{ch}$ represents the real-time excitation current density, or the real-time response current density under the voltage excitation, $i_H$ represents the hydrogen crossover current density, $Q_{Cata.}$ represents the real-time total amount of charges absorbed and desorbed on the surface of the catalyst, $C_{dl}$ represents the double-layer capacitance, U represents the real-time voltage of the single cell, $U_0$ represents the starting voltage of the single cell of the single excitation, and t represents the time;

analyzing data of each single fuel cell separately, setting a voltage window of an initial analysis to $[U_1, U_2]$, the voltage window corresponding to a voltage interval after a completion of hydrogen desorption and before a start of oxygen adsorption, processing all data in a range of the voltage window, and setting:

$$Y = \frac{\int_0^t i_{ch} dt}{t}, X_1 = \frac{1}{t}, X_2 = \frac{U - U_0}{t}, X_3 = \frac{\int_0^t U dt}{t} \quad (3)$$

a first analysis module, configured to, when the formula (1) is used for an analysis, perform ternary linear regression based on $Y=a_0+a_1X_1+a_2X_2+a_3X_3$ to obtain coefficients of respective terms, and to obtain the plurality of parameters of a fuel cell membrane electrode assembly:

$$i_H = a_0, Q_{Cata.-H} = a_1, C_{dl} = a_2, R_e = \frac{1}{a_3} \quad (4)$$

a second analysis module, configured to, when the formula (2) is used for an analysis, perform binary linear regression based on $Y=a_0+a_1X_1+a_2X_2$ to obtain the plurality of parameters of a membrane electrode assembly:

$$i_H=a_0, Q_{Cata.-H}=a_1, C_{dl}=a_2 \quad (5),$$

where $Q_{Cata.-H}$ represents a total amount of charges of hydrogen desorption, and the catalyst electrochemical surface area is analyzed by the total amount of charges of hydrogen desorption:

$$ECSA = \frac{Q_{Cata.-H}}{\Gamma_{Cata.} \times L_{Cata.}}, \quad (6)$$

where ECSA represents the catalyst electrochemical surface area, $\Gamma_{Cata.}$ represents an amount of charges required to cover the surface of the catalyst completely with a single layer of adsorption hydrogen, and $L_{Cata.}$ represents catalyst loading of a measured electrode;

when the first analysis module uses the formula (1) for an analysis, solving the real-time total amount of charges absorbed and desorbed on the surface of the catalyst in a full voltage range under all excitation conditions reversely:

$$Q_{Cata.} = \int_0^t i_{ch}dt - i_H t - C_{dl}(U-U_0) - \frac{\int_0^t U dt}{R_e} \quad (7)$$

when the second analysis module uses the formula (2) for an analysis, solving the real-time total amount of charges absorbed and desorbed on the surface of the catalyst in the full voltage range under all excitation conditions reversely:

$$Q_{Cata.}=\int_0^t i_{ch}dt - i_H t - C_{dl}(U-U_0) \quad (8)$$

a check module, configured to check whether $Q_{Cata.}$ meets a preset condition in the voltage window $[U_1, U_2]$; and an adjustment module, configured to, if the preset condition is not met, adjust the voltage window and repeat the analysis until the preset condition is met, the preset condition being that a standard deviation of all data of $Q_{Cata.}$ in the voltage window is smaller than a limit value.

Additional aspects and advantages of the present disclosure will be given at least in part in the following description, or become apparent at least in part from the following description, or can be learned from practicing of the present disclosure.

BRIEF DESCRIPTION OF DRAWINGS

The above and/or additional aspects and advantages of the present disclosure will become apparent and more readily appreciated from the following description made with reference to the accompanying drawings, in which.

DESCRIPTION OF EMBODIMENTS

Figure 1:
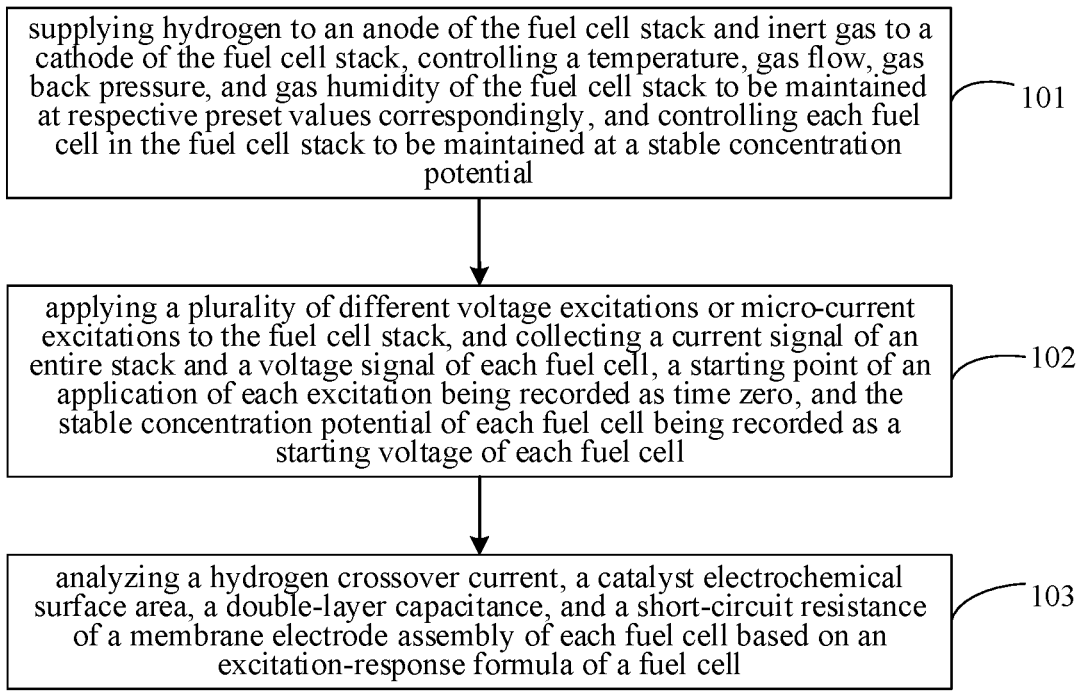
FIG. 1 is a flowchart illustrating a method for simultaneous detection of a plurality of parameters of a plurality of membrane electrode assemblies of a fuel cell stack according to Embodiment 1 of the present disclosure.

The embodiments of the present disclosure will be described in detail below with reference to examples thereof as illustrated in the accompanying drawings, throughout which same or similar elements, or elements having same or similar functions, are denoted by same or similar reference numerals. The embodiments described below with reference to the drawings are illustrative only, and are intended to explain, rather than limiting, the present disclosure.

A method and apparatus for simultaneous detection of a plurality of parameters of a plurality of membrane electrode assemblies of a fuel cell stack will be described below with reference to the figures.

FIG. 1 is a flowchart illustrating a method for simultaneous detection of a plurality of parameters of a plurality of membrane electrode assemblies of a fuel cell stack according to Embodiment 1 of the present disclosure.

As illustrated in FIG. 1, the method for simultaneous detection of the plurality of parameters of the plurality of membrane electrode assemblies of the fuel cell stack includes the following steps.

At step 101, hydrogen is supplied to an anode of a fuel cell stack and inert gas is supplied to a cathode of the fuel cell stack. A temperature, gas flow, gas back pressure, and gas humidity of the fuel cell stack are controlled to be maintained at respective preset values correspondingly. Each fuel cell in the fuel cell stack is controlled to be maintained at a stable concentration potential.

At step 102, a plurality of different voltage excitations or micro-current excitations are applied to the fuel cell stack. A current signal of an entire stack and a voltage signal of each fuel cell are collected. A starting point of an application of each excitation is recorded as time zero. The stable concentration potential of each fuel cell is recorded as a starting voltage of each fuel cell.

At step 103, a hydrogen crossover current, a catalyst electrochemical surface area, a double-layer capacitance, and a short-circuit resistance of a membrane electrode assembly of each fuel cell are analyzed based on an excitation-response formula of a fuel cell.

The excitation-response formula of the fuel cell is:

$$\frac{\int_0^t i_{ch} dt}{t} = i_H + Q_{Cata.} \frac{1}{t} + C_{dl} \frac{U-U_0}{t} + \frac{1}{R_e} \cdot \frac{\int_0^t U dt}{t}, \quad \text{Formula (1)}$$

where $i_{ch}$ represents a real-time excitation current density, or a real-time response current density under a voltage excitation, $i_H$ represents a hydrogen crossover current density, $Q_{Cata.}$ represents a real-time total amount of charges absorbed and desorbed on a surface of a catalyst, $C_{dl}$ represents the double-layer capacitance, U represents a real-time voltage of a single cell, $U_0$ represents a starting voltage of the single cell of a single excitation, $R_e$ represents the short-circuit resistance, and t represents time.

In an embodiment of the present disclosure, the inert gas includes, but not limited to, one of nitrogen, helium, and argon. If the cathode is supplied with air, it is necessary to discharge oxygen completely under a blind end or a gas circulation condition of the cathode, thereby providing an inert gas environment for the cathode.

In an embodiment of the present disclosure, the voltage excitation is controlled as increasing a stack voltage of the fuel cell stack from a stable value to a limit value. The limit value of the stack voltage is determined based on a single fuel cell having a highest response voltage. A response voltage is smaller than a safe voltage threshold.

In an embodiment of the present disclosure, the micro-current excitation includes a constant current excitation and a non-constant current excitation. An end point of an excitation application of each of the plurality of micro-current excitations is determined based on a single fuel cell having a highest response voltage. A response voltage is smaller than a safe voltage threshold. When a high-precision power supply is used for an excitation at a programming current, the programming current is determined as an actually-measured current of the entire stack.

In an embodiment of the present disclosure, the plurality of different voltage excitations or micro-current excitations are different in increase rates of excitation voltages or values of excitation currents.

In an embodiment of the present disclosure, in a process of performing a plurality of excitations, the plurality of excitations are performed at a preset time interval. The preset time interval is determined based on that a voltage of each fuel cell falls to the concentration potential and is maintained for preset time after a previous excitation.

In an embodiment of the present disclosure, when the short-circuit resistance is greater than a preset resistance value, the excitation-response formula of the fuel cell is converted into:

$$\frac{\int_0^t i_{ch} dt}{t} = i_H + Q_{Cata.} \frac{1}{t} + C_{dl} \frac{U-U_0}{t}, \quad \text{Formula (2)}$$

where $i_{ch}$ represents the real-time excitation current density, or the real-time response current density under the voltage excitation, $i_H$ represents the hydrogen crossover current density, $Q_{Cata.}$ represents the real-time total amount of charges absorbed and desorbed on the surface of the catalyst, $C_{dl}$ represents the double-layer capacitance, U represents the real-time voltage of the single cell, $U_0$ represents the starting voltage of the single cell of the single excitation, and t represents the time.

In an embodiment of the present disclosure, data of each single fuel cell is analyzed separately. A voltage window of an initial analysis is set to $[U_1, U_2]$. The voltage window corresponds to a voltage interval after a completion of hydrogen desorption and before a start of oxygen adsorption. All data in a range of the voltage window is processed. It is set that:

$$Y = \frac{\int_0^t i_{ch} dt}{t}, X_1 = \frac{1}{t}, X_2 = \frac{U-U_0}{t}, X_3 = \frac{\int_0^t U dt}{t}. \quad (3)$$

When the formula (1) is used for an analysis, ternary linear regression is performed based on $Y=a_0+a_1X_1+a_2X_2+a_3X_3$ to obtain coefficients of respective terms, and to obtain the plurality of parameters of a fuel cell membrane electrode:

$$i_H = a_0, Q_{Cata.-H} = a_1, C_{dl} = a_2, R_e = \frac{1}{a_3}. \quad (4)$$

When the formula (2) is used for an analysis, binary linear regression is performed based on $Y=a_0+a_1X_1+a_2X_2$ to obtain the plurality of parameters of a membrane electrode:

$$i_H=a_0, Q_{Cata.-H}=a_1, C_{dl}=a_2 \quad (5),$$

where $Q_{Cata.-H}$ represents a total amount of charges of hydrogen desorption. The catalyst electrochemical surface area is analyzed by the total amount of charges of hydrogen desorption:

$$ECSA = \frac{Q_{Cata.-H}}{\Gamma_{Cata.} \times L_{Cata.}}, \quad (6)$$

where ECSA represents the catalyst electrochemical surface area, $\Gamma_{Cata.}$ represents an amount of charges required to cover the surface of the catalyst completely with a single layer of adsorption hydrogen, and $L_{Cata.}$ represents catalyst loading of a measured electrode.

In an embodiment of the present disclosure, when the formula (1) is used for an analysis, the real-time total amount of charges absorbed and desorbed on the surface of the catalyst in a full voltage range under all excitation conditions is solved reversely:

$$Q_{Cata.} = \int_0^t i_{ch} dt - i_H t - C_{dl}(U-U_0) - \frac{\int_0^t U dt}{R_e}. \quad (7)$$

When the formula (2) is used for an analysis, the real-time total amount of charges absorbed and desorbed on the surface of the catalyst in the full voltage range under all excitation conditions is solved reversely:

$$Q_{Cata.} = \int_0^t i_{ch} dt - i_H t - C_{dl}(U-U_0) \quad (8)$$

It is checked whether $Q_{Cata.}$ meets a preset condition in the voltage window $[U_1, U_2]$. If not, the voltage window is adjusted and the analysis is repeated until the preset condition is met. The preset condition is that a standard deviation of all data of $Q_{Cata.}$ in the voltage window is smaller than a limit value.

Specifically, (1) gas supply and operating condition control: hydrogen is supplied to the anode of the fuel cell stack and the inert gas is supplied to the cathode of the fuel cell stack. The temperature, gas back pressure, and gas humidity of the fuel cell stack are controlled to stabilize. Each fuel cell is waited for to reach and maintain the stable concentration potential. The inert gas may be nitrogen, helium or argon.

Furthermore, if the cathode is supplied with air, it is necessary to discharge oxygen completely under the blind end or the gas circulation condition of the cathode, thereby providing the inert gas environment for the cathode.

Specifically, (2) excitation application and response signal collection: an external power supply is used to apply a voltage excitation or micro-current excitation to the fuel cell stack. The current signal of the entire stack and the voltage signal of each fuel cell are collected. A starting point of an application of each excitation is recorded as time zero. The stable concentration potential of each fuel cell is recorded as the starting voltage of each fuel cell. A plurality of differentiated excitations are required during each measurement of parameters of the membrane electrode. Differences lie in increase rates of the excitation voltages or values of the excitation currents. In a process of performing a plurality of excitations, it is necessary to wait for a previous excitation to be completed and voltages of all fuel cells to drop to the concentration potential and stabilize for a period of time before applying a next excitation.

Further, the voltage excitation is to control the stack voltage to increase from a stable value to a limit value. The limit value of the stack voltage is determined based on a single fuel cell having a highest response voltage. The response voltage of the single fuel cell shall not exceed a safety threshold. Each of the plurality of micro-current excitations includes a constant current excitation and a non-constant current excitation. An end point of an excitation application is determined based on a single fuel cell having a highest response voltage. The response voltage of the single fuel cell shall not exceed a safety threshold. When a high-precision power supply is used for an excitation at a programming current, the programming current may be used as an actually-measured current of the entire stack. When a common power supply is used for an excitation, a real-time current of the entire stack needs to be measured.

Specifically, (3) parameter analysis: the hydrogen crossover current, the catalyst electrochemical surface area, the double-layer capacitance, and the short-circuit resistance of each membrane electrode assembly are analyzed based on the excitation-response formula of the fuel cell.

Figure 2:
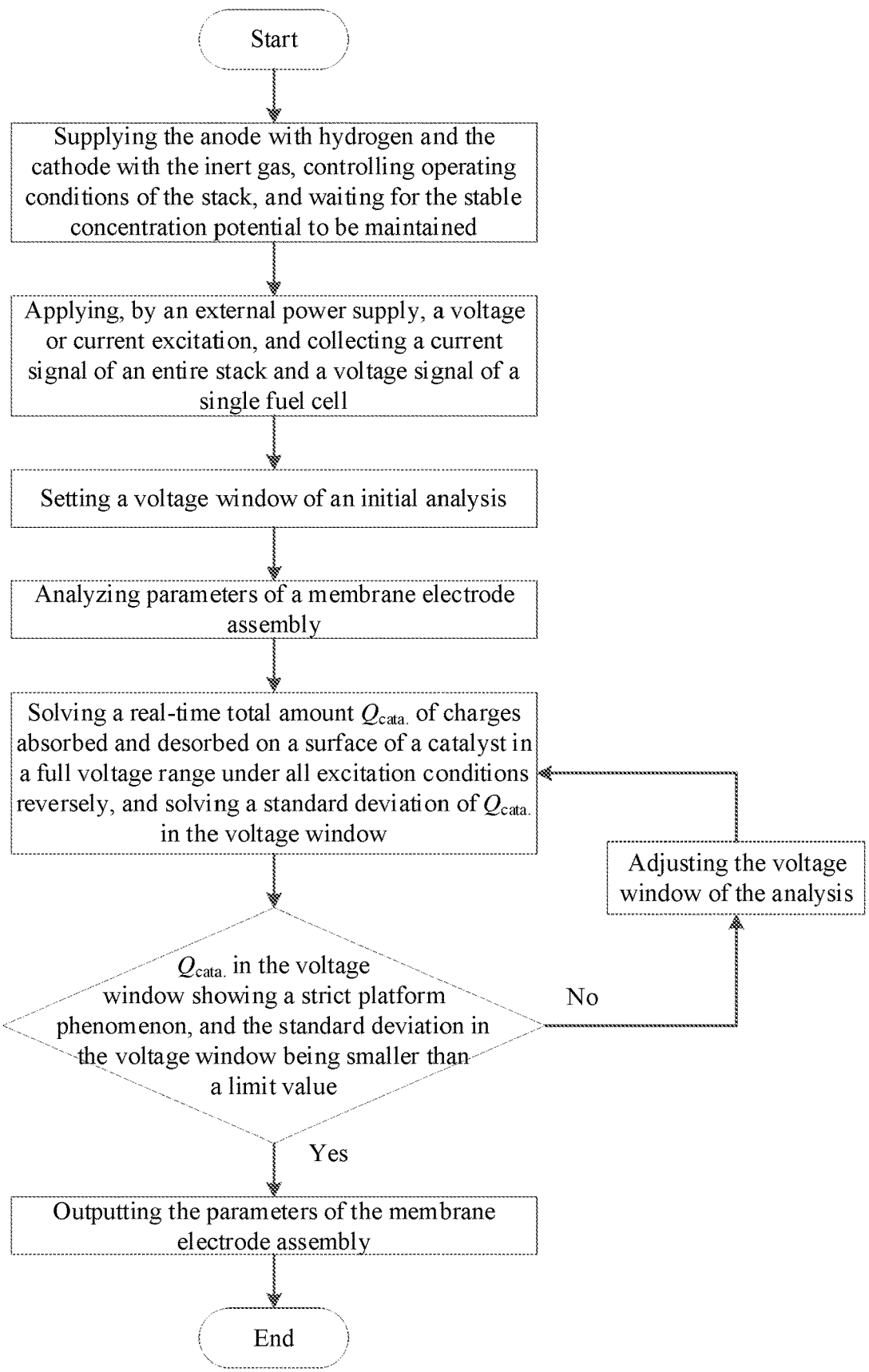
FIG. 2 is a flowchart illustrating a method for simultaneous detection of a plurality of parameters of a plurality of membrane electrode assemblies of a fuel cell stack according to an embodiment of the present disclosure.

As an example of a scenario, an embodiment of the present disclosure is specifically described in combination with a test of a plurality of parameters of a membrane electrode assembly of a stack containing seven fuel cells. The flowchart illustrating the method for simultaneous detection of the plurality of parameters of the plurality of membrane electrode assemblies of the fuel cell stack is as illustrated in FIG. 2. A test and analysis process is divided into three steps.

(1) Gas supply and operating condition control: hydrogen is supplied to the anode of the fuel cell stack and the inert gas is supplied to the cathode of the fuel cell stack. In an embodiment, nitrogen is used as the inert gas. The hydrogen flow is 4 SLPM and the nitrogen flow is 15.8 SLPM. A temperature of the fuel cell stack is controlled as 50° C., gas back pressure of the fuel cell stack is controlled as 0.2 bar, gas relative humidity of the fuel cell stack is controlled as 100%. Each fuel cell is waited for to reach and maintain a stable concentration potential.

(2) Excitation application and response signal collection: an external power supply is used to apply a voltage excitation or micro-current excitation to the fuel cell stack. The current signal of the entire stack and the voltage signal of each fuel cell are collected. A starting point of an application of each excitation is recorded as time zero. The stable concentration potential of each fuel cell is recorded as the starting voltage of each fuel cell. A plurality of differentiated excitations are required during each measurement of parameters of the membrane electrode. Differences lie in increase rates of the excitation voltages or values of the excitation currents. In a process of performing a plurality of excitations, it is necessary to wait for a previous excitation to be completed and voltages of all fuel cells to drop to the concentration potential and stabilize for a period of time before applying a next excitation. Each of the plurality of voltage excitations is to control the stack voltage to increase from a stable value to a limit value. The limit value of the stack voltage is determined based on a single fuel cell having a highest response voltage. The response voltage of the single fuel cell shall not exceed a safety threshold. Each of the plurality of micro-current excitations includes a constant current excitation and a non-constant current excitation. An end point of an excitation application is determined based on a single fuel cell having a highest response voltage. The response voltage of the single fuel cell shall not exceed a safety threshold. When a high-precision power supply is used for an excitation at a programming current, the programming current may be used as an actually-measured current of the entire stack. When a common power supply is used for an excitation, a real-time current of the entire stack needs to be measured.

Figure 3:
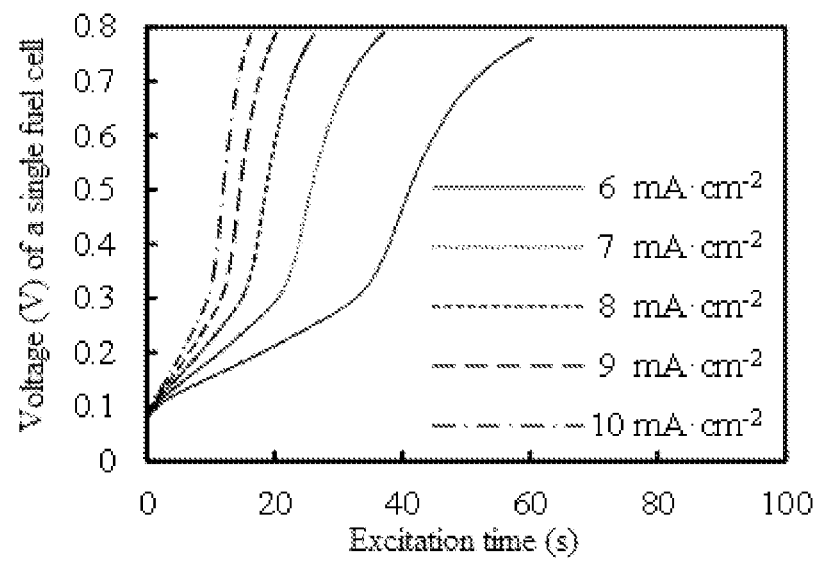
FIG. 3 is an excitation-voltage response diagram during a measurement of a plurality of parameters of a membrane electrode assembly according to an embodiment of the present disclosure.

In an embodiment, the high-precision power supply is used to apply constant current excitation. Densities of the plurality of excitation currents are 6 mA·cm$^{-2}$, 7 mA·cm$^{-2}$, 8 mA·cm$^{-2}$, 9 mA·cm$^{-2}$, 10 mA·cm$^{-2}$. Excitation is terminated when the highest voltage of a single fuel cell reaches a safety threshold of 0.8V. A data acquisition system is used to collect a voltage of each single fuel cell. A voltage sampling frequency is 100 Hz. An excitation-voltage response diagram of a first single fuel cell in the stack is as illustrated in FIG. 3.

(3) Parameter analysis: the hydrogen crossover current, the catalyst electrochemical surface area, the double-layer capacitance, and the short-circuit resistance of each membrane electrode assembly are analyzed based on the excitation-response formula of the fuel cell.

A complete excitation-response formula is:

$$\frac{\int_0^t i_{ch} dt}{t} = i_H + Q_{Cata.}\frac{1}{t} + C_{dl}\frac{U - U_0}{t} + \frac{1}{R_e} \cdot \frac{\int_0^t U dt}{t}. \quad \text{Formula (1)}$$

During simplified treatment or when the short-circuit resistance is too large, a term of electronic short-circuit may be ignored, and a simplified excitation-response formula may be adopted. The simplified excitation-response formula is:

$$\frac{\int_0^t i_{ch} dt}{t} = i_H + Q_{Cata.}\frac{1}{t} + C_{dl}\frac{U - U_0}{t}. \quad \text{Formula (2)}$$

In the formula (2), $i_{ch}$ represents the real-time excitation current density, or the real-time response current density under the voltage excitation, $i_H$ represents the hydrogen crossover current density, $Q_{Cata.}$ represents the real-time total amount of charges absorbed and desorbed on the surface of the catalyst (involving hydrogen desorption and oxygen adsorption), $C_{dl}$ represents the double-layer capacitance, U represents the real-time voltage of the single cell, $U_0$ represents the starting voltage of the single cell of the single excitation, $R_e$ represents the short-circuit resistance, and t represents the time.

In an embodiment, the complete excitation-response formula is used for analysis. First, a voltage window of an initial analysis is set to [0.4V, 0.6V]. The voltage window corresponds to a voltage interval, which is set initially, after a completion of hydrogen desorption and before a start of oxygen adsorption. All data in a range of the voltage window is processed. It is set that:

$$Y = \frac{\int_0^t i_{ch}dt}{t}, X_1 = \frac{1}{t}, X_2 = \frac{U-U_0}{t}, X_3 = \frac{\int_0^t Udt}{t}. \quad (3)$$

Ternary linear regression is performed based on $Y=a_0+a_1X_1+a_2X_2+a_3X_3$ to obtain coefficients of respective terms, such that the plurality of parameters of the membrane electrode assembly may be obtained. An analysis result of the first single fuel cell is:

$$i_H=a_0=4.13 \text{ mA}\cdot\text{cm}^{-2}, Q_{cata.-H}=a_1=46.95 \text{ mC}\cdot\text{cm}^{-2}$$

$$C_{d1} = a_2 = 48.82 \text{ mF}\cdot\text{cm}^{-2}, R_e = \frac{1}{a_3} = 999.4 \text{ }\Omega\cdot\text{cm}^2.$$

In the above formula, $Q_{Cata.-H}$ represents a total amount of charges of hydrogen desorption. The catalyst electrochemical surface area is analyzed by the total amount of charges of hydrogen desorption:

$$ECSA = \frac{Q_{Cata.-H}}{\Gamma_{Cata.} \times L_{Cata.}}, \quad (6)$$

In the formula (6), ECSA represents the catalyst electrochemical surface area, $\Gamma_{Cata.}$ represents an amount of charges required to cover the surface of the catalyst completely with a single layer of adsorption hydrogen, and $L_{Cata.}$ represents catalyst loading of a measured electrode.

After the solution is found, the analysis result needs to be verified reversely. When the complete excitation-response formula is used for the analysis, it is necessary to solve the real-time total amount of charges absorbed and desorbed on the surface of the catalyst in the full voltage range under all excitation conditions reversely:

$$Q_{Cata.} = \int_0^t i_{ch}dt - i_Ht - C_{d1}(U - U_0) - \frac{\int_0^t Udt}{R_e}. \quad (7)$$

It is checked whether $Q_{Cata.}$ meets a strict platform phenomenon in the voltage window [0.4V, 0.6V]. If the platform phenomenon is not strict, the voltage window needs to be adjusted and the analysis needs to be repeated until a verification requirement is met. The verification requirement is that a standard deviation of all data of $Q_{Cata.}$ in the adjusted voltage window is smaller than a limit value.

Figure 4:
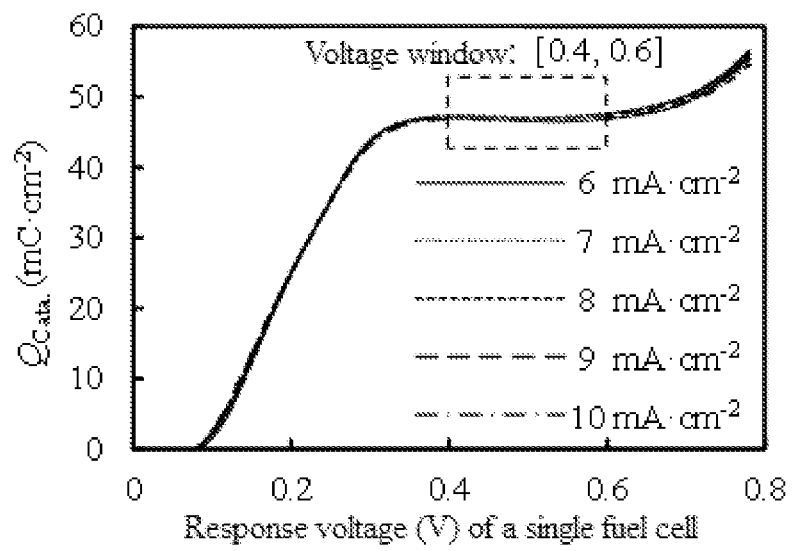
FIG. 4 is a reverse solution diagram of a real-time total amount of charges absorbed and desorbed on a surface of a catalyst in a full voltage range under all excitation conditions according to an embodiment of the present disclosure.

In an embodiment, a reverse solution diagram of a real-time total amount of charges absorbed and desorbed on a surface of a catalyst of the first single fuel cell in a full voltage range under all excitation conditions is as illustrated in FIG. 4. The inverse solution result is displayed in the voltage window [0.4V, 0.6V]. $Q_{Cata.}$ shows the strict platform phenomenon. The standard deviation of all data of $Q_{Cata.}$ in the voltage window is smaller than the limit value. The test and analysis process is completed. Analysis results obtained are final parameters of the membrane electrode.

With the method for simultaneous detection of the plurality of parameters of the plurality of membrane electrode assemblies of the fuel cell stack according to the embodiment of the present disclosure, hydrogen is supplied to an anode of a fuel cell stack and inert gas is supplied to a cathode of the fuel cell stack. A temperature, gas back pressure, and gas humidity of the fuel cell stack are controlled to be maintained at respective preset values correspondingly. Each fuel cell in the fuel cell stack is controlled to be maintained at a stable concentration potential. A plurality of different voltage excitations or micro-current excitations are applied to the fuel cell stack. A current signal of an entire stack and a voltage signal of each fuel cell are collected. A starting point of an application of each excitation is recorded as time zero, and the stable concentration potential of each fuel cell is recorded as a starting voltage of each fuel cell. A hydrogen crossover current, a catalyst electrochemical surface area, a double-layer capacitance, and a short-circuit resistance of a membrane electrode assembly of each fuel cell are analyzed based on an excitation-response formula of a fuel cell. The present disclosure detects the hydrogen crossover current, the catalyst electrochemical surface area, the double-layer capacitance, and the short-circuit resistance of the plurality of membrane electrode assemblies of the fuel cell stack simultaneously, and basically overcomes various defects in measuring parameters of the membrane electrode. The present disclosure does not limit the form of a current or voltage excitation, and has low requirements on a voltage sampling frequency. An analytical model is complete and an analytical process is highly stable. Consequently, accuracy and precision of a parameter test of a membrane electrode assembly are greatly improved.

To implement the above embodiments, the present disclosure also provides an apparatus for simultaneous detection of a plurality of parameters of a plurality of membrane electrode assemblies of a fuel cell stack.

Figure 5:
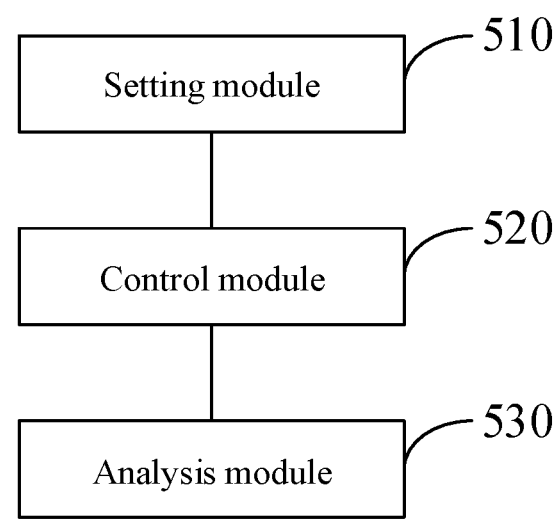
FIG. 5 is a block diagram showing a structure of an apparatus for simultaneous detection of a plurality of parameters of a plurality of membrane electrode assemblies of a fuel cell stack according to an embodiment of the present disclosure.

FIG. 5 is a block diagram showing a structure of an apparatus for simultaneous detection of a plurality of parameters of a plurality of membrane electrode assemblies of a fuel cell stack according to an embodiment of the present disclosure.

As illustrated in FIG. 5, the apparatus for simultaneous detection of a plurality of parameters of a plurality of membrane electrode assemblies of a fuel cell stack includes a setting module 510, a control module 520, and an analysis module 530.

The setting module 510 is configured to supply hydrogen to an anode of a fuel cell stack and inert gas to a cathode of the fuel cell stack, to control a temperature, gas flow, gas back pressure, and gas humidity of the fuel cell stack to be maintained at respective preset values correspondingly, and to control each fuel cell in the fuel cell stack to be maintained at a stable concentration potential.

The control module 520 is configured to apply a plurality of different voltage excitations or micro-current excitations to the fuel cell stack, and to collect a current signal of an entire stack and a voltage signal of each fuel cell. A starting point of an application of each excitation is recorded as time zero. The concentration potential of each fuel cell is recorded as a starting voltage of each fuel cell.

The analysis module 530 is configured to analyze a hydrogen crossover current, a catalyst electrochemical surface area, a double-layer capacitance, and a short-circuit resistance of a membrane electrode assembly of each fuel cell based on an excitation-response formula of a fuel cell. The excitation-response formula of the fuel cell is:

$$\frac{\int_0^t i_{ch} dt}{t} = i_H + Q_{Cata.} \frac{1}{t} + C_{d1} \frac{U - U_0}{t} + \frac{1}{R_e} \cdot \frac{\int_0^t U dt}{t}. \quad \text{Formula (1)}$$

where $i_{ch}$ represents a real-time excitation current density, or a real-time response current density under a voltage excitation, $i_H$ represents a hydrogen crossover current density, $Q_{Cata.}$ represents a real-time total amount of charges absorbed and desorbed on a surface of a catalyst, $C_{dl}$ represents the double-layer capacitance, U represents a real-time voltage of a single cell, $U_0$ represents a starting voltage of the single cell of a single excitation, $R_e$ represents the short-circuit resistance, and t represents time.

With the apparatus for simultaneous detection of the plurality of parameters of the plurality of membrane electrode assemblies of the fuel cell stack according to the embodiment of the present disclosure, hydrogen is supplied to an anode of a fuel cell stack and inert gas is supplied to a cathode of the fuel cell stack. A temperature, gas flow, gas back pressure, and gas humidity of the fuel cell stack are controlled to be maintained at respective preset values correspondingly. Each fuel cell in the fuel cell stack is controlled to be maintained at a stable concentration potential. A plurality of different voltage excitations or micro-current excitations are applied to the fuel cell stack. A current signal of an entire stack and a voltage signal of each fuel cell are collected. A starting point of an application of each excitation is recorded as time zero, and the stable concentration potential of each fuel cell is recorded as a starting voltage of each fuel cell. A hydrogen crossover current, a catalyst electrochemical surface area, a double-layer capacitance, and a short-circuit resistance of a membrane electrode assembly of each fuel cell are analyzed based on an excitation-response formula of a fuel cell. Consequently, the hydrogen crossover current, the catalyst electrochemical surface area, the double-layer capacitance, and the short-circuit resistance of the plurality of membrane electrode assemblies of the fuel cell stack are detected simultaneously, thereby basically overcoming various defects in measuring parameters of the membrane electrode. The present disclosure does not limit the form of a current or voltage excitation, and has low requirements on a voltage sampling frequency. An analytical model is complete and an analytical process is highly stable. Consequently, accuracy and precision of a parameter test of a membrane electrode assembly are greatly improved.

In an embodiment of the present disclosure, the apparatus further includes: the control module, configured to control each of the plurality of voltage excitations as increasing a stack voltage of the fuel cell stack from a stable value to a limit value, the limit value of the stack voltage being determined based on a single fuel cell having a highest response voltage, and a response voltage being smaller than a safe voltage threshold; and each of the plurality of micro-current excitations includes a constant current excitation and a non-constant current excitation, a determination module, configured to determine an end point of an excitation application of each of the plurality of micro-current excitations based on a single fuel cell having a highest response voltage, a response voltage being smaller than a safe voltage threshold; wherein when a high-precision power supply is used for an excitation at a programming current, the programming current is determined as an actually-measured current of the entire stack.

In an embodiment of the present disclosure, the apparatus further includes an excitation module, configured to perform, in a process of performing a plurality of excitations, the plurality of excitations at a preset time interval, the preset time interval being determined based on that a voltage of each fuel cell falls to the concentration potential and is maintained for preset time after a previous excitation.

In an embodiment of the present disclosure, the apparatus further includes, when the short-circuit resistance is greater than a preset resistance value, or when an influence of the short-circuit resistance is ignored for simplification processing, converting the excitation-response formula of the fuel cell into:

$$\frac{\int_0^t i_{ch} dt}{t} = i_H + Q_{Cata.} \frac{1}{t} + C_{d1} \frac{U - U_0}{t}. \quad \text{Formula (2)}$$

where $i_{ch}$ represents the real-time excitation current density, or the real-time response current density under the voltage excitation, $i_H$ represents the hydrogen crossover current density, $Q_{Cata.}$ represents the real-time total amount of charges absorbed and desorbed on the surface of the catalyst, $C_{dl}$ represents the double-layer capacitance, U represents the real-time voltage of the single cell, $U_0$ represents the starting voltage of the single cell of the single excitation, and t represents the time; analyzing data of each single fuel cell separately, setting a voltage window of an initial analysis to $[U_1, U_2]$, the voltage window corresponding to a voltage interval after a completion of hydrogen desorption and before a start of oxygen adsorption, processing all data in a range of the voltage window, and setting:

$$Y = \frac{\int_0^t i_{ch} dt}{t}, X_1 = \frac{1}{t}, X_2 = \frac{U - U_0}{t}, X_3 = \frac{\int_0^t U dt}{t}. \quad (3)$$

a first analysis module, configured to, when the formula (1) is used for an analysis, perform ternary linear regression based on $Y = a_0 + a_1 X_1 + a_2 X_2 + a_3 X_3$ to obtain coefficients of respective terms, and to obtain the plurality of parameters of a fuel cell membrane electrode:

$$i_H = a_0, Q_{Cata.-H} = a_1, C_{d1} = a_2, R_e = \frac{1}{a_3}. \quad (4)$$

a second analysis module, configured to, when the formula (2) is used for an analysis, perform binary linear regression based on $Y=a_0+a_1X_1+a_2X_2$ to obtain the plurality of parameters of a membrane electrode:

$$i_H=a_0, Q_{Cata.-H}=a_1, C_{dl}=a_2 \quad (5),$$

where $Q_{Cata.-H}$ represents a total amount of charges of hydrogen desorption, and the catalyst electrochemical surface area is analyzed by the total amount of charges of hydrogen desorption:

$$ECSA = \frac{Q_{Cata.-H}}{\Gamma_{Cata.} \times L_{Cata.}}, \quad (6)$$

where ECSA represents the catalyst electrochemical surface area, $\Gamma_{Cata.}$ represents an amount of charges required to cover the surface of the catalyst completely with a single layer of adsorption hydrogen, and $L_{Cata.}$ represents catalyst loading of a measured electrode;

when the first analysis module uses the formula (1) for an analysis, solving the real-time total amount of charges absorbed and desorbed on the surface of the catalyst in a full voltage range under all excitation conditions reversely:

$$Q_{Cata.} = \int_0^t i_{ch} dt - i_H t - C_{dl}(U-U_0) - \frac{\int_0^t U dt}{R_e} \quad (7)$$

when the second analysis module uses the formula (2) for an analysis, solving the real-time total amount of charges absorbed and desorbed on the surface of the catalyst in the full voltage range under all excitation conditions reversely:

$$Q_{Cata.} = \int_0^t i_{ch} dt - i_H t - C_{dl}(U-U_0) \quad (8)$$

a check module, configured to check whether $Q_{Cata.}$ meets a preset condition in the voltage window $[U_1, U_2]$; and an adjustment module, configured to, if the preset condition is not met, adjust the voltage window and repeat the analysis until the preset condition is met, the preset condition being that a standard deviation of all data of $Q_{Cata.}$ in the voltage window is smaller than a limit value.

It is to be noted that the above description of the embodiments of the method for simultaneous detection of the plurality of parameters of the plurality of membrane electrode assemblies of the fuel cell stack is also applicable to the apparatus for simultaneous detection of the plurality of parameters of the plurality of membrane electrode assemblies of the fuel cell stack according to the embodiment, and thus details thereof will be omitted here.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. The appearances of the above phrases in various places throughout this specification are not necessarily referring to the same embodiment or example of the present disclosure. Furthermore, the particular features, structures, materials, or characteristics may be combined in any suitable manner in one or more embodiments or examples. In addition, different embodiments or examples and features of different embodiments or examples described in the specification may be combined by those skilled in the art without mutual contradiction.

In addition, terms such as "first" and "second" are used herein for purposes of description and are not intended to indicate or imply relative importance, or to implicitly show the number of technical features indicated. Thus, the feature defined with "first" and "second" may comprise one or more this feature. In the description of the present disclosure, "a plurality of" means at least two, for example, two or three, unless specified otherwise.

Any procedure or method described in a flowchart or described in any other way herein may be understood to include one or more modules, portions or parts of codes of executable instructions that realize particular logical functions or steps of procedures. Moreover, a scope of a preferred embodiment of the present disclosure includes other implementations in which an order of execution is different from an order depicted or discussed, including executing functions in a substantially simultaneous manner or in an opposite order according to the related functions, which can be appreciated by those skilled in the art in the technical field to which the embodiments of the present disclosure belong.

The logic and/or step described in other manners herein or shown in the flowchart, for example, a particular sequence table of executable instructions for realizing the logical function, may be specifically achieved in any computer readable medium to be used by an instruction execution system, device or equipment (such as a system based on computers, a system comprising processors or other systems capable of obtaining the instruction from the instruction execution system, device and equipment and executing the instruction), or to be used in combination with the instruction execution system, device and equipment. As to the specification, "the computer readable medium" may be any device adaptive for including, storing, communicating, propagating or transferring programs to be used by or in combination with the instruction execution system, device or equipment. More specific examples of the computer readable medium comprise, but not limited to: an electronic connection (an electronic device) with one or more wires, a portable computer enclosure (a magnetic device), a Random Access Memory (RAM), a Read Only Memory (ROM), an Erasable Programmable Read-Only Memory (EPROM or a flash memory), an optical fiber device, and a portable Compact Disk Read-Only Memory (CDROM). In addition, the computer readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It can be appreciated that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a Programmable Gate Array (PGA), a Field Programmable Gate Array (FPGA), etc.

It can be appreciated by those skilled in the art that all or a part of the steps carried by the method in the above embodiments may be completed by relevant hardware instructed by a program. The program may be stored in a computer readable storage medium. When the program is executed, one or a combination of the steps of the method in the above embodiments may be completed.

In addition, individual functional units in the embodiments of the present disclosure may be integrated in one processing module or may be separately physically present, or two or more units may be integrated in one module. The integrated module as described above may be achieved in the form of hardware, or may be achieved in the form of a software functional module. If the integrated module is achieved in the form of a software functional module and sold or used as a separate product, the integrated module may also be stored in a computer readable storage medium.

The storage medium mentioned above may be a read-only memory, a magnetic disk or a compact disc, etc. Although the embodiments of the present disclosure have been shown and described above, it can be appreciated that the above embodiments are illustrative, and cannot be construed to limit the present disclosure. Changes, alternatives, and modifications in the embodiments can be made by those skilled in the art without departing from the scope of the present disclosure.

What is claimed is:

1. A method for simultaneous detection of a plurality of parameters of a plurality of membrane electrode assemblies of a fuel cell stack, comprising steps of:

supplying hydrogen to an anode of the fuel cell stack and inert gas to a cathode of the fuel cell stack, controlling a temperature, gas flow, gas back pressure, and gas humidity of the fuel cell stack to be maintained at respective preset values correspondingly, and controlling each fuel cell in the fuel cell stack to be maintained at a stable concentration potential;

applying a plurality of different voltage excitations or micro-current excitations to the fuel cell stack, and collecting a current signal of an entire stack and a voltage signal of each fuel cell, a starting point of an application of each excitation being recorded as time zero, and the stable concentration potential of each fuel cell being recorded as a starting voltage of each fuel cell; and analyzing a hydrogen crossover current, a catalyst electrochemical surface area, a double-layer capacitance, and a short-circuit resistance of a membrane electrode assembly of each fuel cell according to an excitation-response formula of a fuel cell, the excitation-response formula of the fuel cell being:

$$\frac{\int_0^t i_{ch} dt}{t} = i_H + Q_{Cata.} \frac{1}{t} + C_{dl} \frac{U - U_0}{t} + \frac{1}{R_e} \cdot \frac{\int_0^t U dt}{t}, \quad \text{Formula (1)}$$

where $i_{ch}$ represents a real-time excitation current density or a real-time response current density under a voltage excitation, $i_H$ represents a hydrogen crossover current density, $Q_{Cata.}$ represents a real-time total amount of charges absorbed and desorbed on a surface of a catalyst, $C_{dl}$ represents the double-layer capacitance, U represents a real-time voltage of a single cell, $U_0$ represents a starting voltage of the single cell of a single excitation, $R_e$ represents the short-circuit resistance, and t represents time, wherein data of each single fuel cell is analyzed separately, a voltage window of an initial analysis is set to $[U_1, U_2]$, the voltage window corresponding to a voltage interval after a completion of hydrogen desorption and before a start of oxygen adsorption, all data in a range of the voltage window is processed, and it is set that:

$$Y = \frac{\int_0^t i_{ch} dt}{t}, X_1 = \frac{1}{t}, X_2 = \frac{U - U_0}{t}, X_3 = \frac{\int_0^t U dt}{t}; \quad (3)$$

when the formula (1) is used for an analysis, ternary linear regression is performed based on $Y = a_0 + a_1 X_1 + a_2 X_2 + a_3 X_3$ to obtain coefficients of respective terms, and to obtain the plurality of parameters of a fuel cell membrane electrode:

$$i_H = a_0, Q_{Cata.-H} = a_1, C_{dl} = a_2, R_e = \frac{1}{a_3}; \quad (4)$$

when formula (2)

$$\frac{\int_0^t i_{ch} dt}{t} = i_H + Q_{Cata.} \frac{1}{t} + C_{dl} \frac{U - U_0}{t}$$

is used for an analysis, binary linear regression is performed based on $Y = a_0 + a_1 X_1 + a_2 X_2$ to obtain the plurality of parameters of a membrane electrode:

$$i_H = a_0, Q_{Cata.-H} = a_1, C_{dl} = a_2 \quad (5),$$

where $Q_{Cata.-H}$ represents a total amount of charges of hydrogen desorption, and the catalyst electrochemical surface area is analyzed by the total amount of charges of hydrogen desorption:

$$ECSA = \frac{Q_{Cata.-H}}{\Gamma_{Cata.} \times L_{Cata.}}, \quad (6)$$

where ECSA represents the catalyst electrochemical surface area, $\Gamma_{Cata.}$ represents an amount of charges required to cover the surface of the catalyst completely with a single layer of adsorption hydrogen, and $L_{Cata.}$ represents catalyst loading of a measured electrode;

when the formula (1) is used for an analysis, the real-time total amount of charges absorbed and desorbed on the surface of the catalyst in a full voltage range under all excitation conditions is solved reversely:

$$Q_{Cata.} = \int_0^t i_{ch} dt - i_H t - C_{dl}(U - U_0) - \frac{\int_0^t U dt}{R_e} \quad (7)$$

when the formula (2) is used for an analysis, the real-time total amount of charges absorbed and desorbed on the surface of the catalyst in the full voltage range under all excitation conditions is solved reversely:

$$Q_{Cata.} = \int_0^t i_{ch} dt - i_H t - C_{dl}(U - U_0) \quad (8), \text{ and}$$

it is checked whether $Q_{Cata.}$ meets a preset condition in the voltage window $[U_1, U_2]$, if not, the voltage window is adjusted and the analysis is repeated until the preset condition is met, the preset condition being that a standard deviation of all data of $Q_{Cata.}$ in the voltage window is smaller than a limit value.

2. The method of claim 1, wherein each of the plurality of voltage excitations is controlled as increasing a stack voltage of the fuel cell stack from a stable value to a limit value, the limit value of the stack voltage being determined based on a single fuel cell having a highest response voltage, and a response voltage being smaller than a safe voltage threshold.

3. The method of claim 1, wherein each of the plurality of micro-current excitations comprises a constant current excitation and a non-constant current excitation;
   an end point of an excitation application of each of the plurality of micro-current excitations is determined based on a single fuel cell having a highest response voltage, a response voltage being smaller than a safe voltage threshold; and
   when a high-precision power supply is used for an excitation at a programming current, the programming current is determined as an actually-measured current of the entire stack.

4. The method of claim 1, wherein in a process of performing a plurality of excitations, the plurality of excitations is performed at a preset time interval, the preset time interval being determined based on that a voltage of each fuel cell falls to the concentration potential and is maintained for preset time after a previous excitation.

5. The method of claim 1, wherein when the short-circuit resistance is greater than a preset resistance value, or when an influence of the short-circuit resistance is ignored for simplification processing, the excitation-response formula of the fuel cell is converted into:

$$\frac{\int_0^t i_{ch} dt}{t} = i_H + Q_{Cata.} \frac{1}{t} + C_{dl} \frac{U - U_0}{t}, \quad \text{Formula (2)}$$

where $i_{ch}$ represents the real-time excitation current density or the real-time response current density under the voltage excitation, $i_H$ represents the hydrogen crossover current density, $Q_{Cata.}$ represents the real-time total amount of charges absorbed and desorbed on the surface of the catalyst, $C_{dl}$ represents the double-layer capacitance, U represents the real-time voltage of the single cell, $U_0$ represents the starting voltage of the single cell of the single excitation, and t represents the time.

6. An apparatus for simultaneous detection of a plurality of parameters of a plurality of membrane electrode assemblies of a fuel cell stack, comprising a memory having computer instructions stored thereon and a processor, wherein the processor is configured to invoke and execute the computer instructions stored in the memory to perform operations comprising:
   supplying hydrogen to an anode of the fuel cell stack and inert gas to a cathode of the fuel cell stack, controlling a temperature, gas flow, gas back pressure, and gas humidity of the fuel cell stack to be maintained at respective preset values correspondingly, and controlling each fuel cell in the fuel cell stack to be maintained at a stable concentration potential;
   applying a plurality of different voltage excitations or micro-current excitations to the fuel cell stack, and collecting a current signal of an entire stack and a voltage signal of each fuel cell, a starting point of an application of each excitation being recorded as time zero, and the concentration potential of each fuel cell being recorded as a starting voltage of each fuel cell; and
   analyzing a hydrogen crossover current, a catalyst electrochemical surface area, a double-layer capacitance, and a short-circuit resistance of a membrane electrode assembly of each fuel cell based on an excitation-response formula of a fuel cell, the excitation-response formula of the fuel cell being:

$$\frac{\int_0^t i_{ch} dt}{t} = i_H + Q_{Cata.} \frac{1}{t} + C_{dl} \frac{U - U_0}{t} + \frac{1}{R_e} \cdot \frac{\int_0^t U dt}{t}, \quad \text{Formula (1)}$$

where $i_{ch}$ represents a real-time excitation current density, or a real-time response current density under a voltage excitation, $i_H$ represents a hydrogen crossover current density, $Q_{Cata.}$ represents a real-time total amount of charges absorbed and desorbed on a surface of a catalyst, $C_{dl}$ represents the double-layer capacitance, U represents a real-time voltage of a single cell, $U_0$ represents a starting voltage of the single cell of a single excitation, $R_e$ represents the short-circuit resistance, and t represents time, wherein data of each single fuel cell is analyzed separately, a voltage window of an initial analysis is set to $[U_1, U_2]$, the voltage window corresponding to a voltage interval after a completion of hydrogen desorption and before a start of oxygen adsorption, all data in a range of the voltage window is processed, and it is set that:

$$Y = \frac{\int_0^t i_{ch} dt}{t}, \; X_1 = \frac{1}{t}, \; X_2 = \frac{U - U_0}{t}, \; X_3 = \frac{\int_0^t U dt}{t}, \quad (3)$$

when the formula (1) is used for an analysis, ternary linear regression is performed based on $Y = a_0 + a_1 X_1 + a_2 X_2 + a_3 X_3$ to obtain coefficients of respective terms, and to obtain the plurality of parameters of a fuel cell membrane electrode:

$$i_H = a_0, \; Q_{Cata.-H} = a_1, \; C_{dl} = a_2, \; R_e = \frac{1}{a_3}, \quad (4)$$

when formula (2)

$$\frac{\int_0^t i_{ch} dt}{t} = i_H + Q_{Cata.} \frac{1}{t} + C_{dl} \frac{U - U_0}{t}$$

is used for an analysis, binary linear regression is performed based on $Y = a_0 + a_1 X_1 + a_2 X_2$ to obtain the plurality of parameters of a membrane electrode:

$$i_H = a_0, Q_{Cata.-H} = a_1, C_{dl} = a_2 \quad (5),$$

where $Q_{Cata.-H}$ represents a total amount of charges of hydrogen desorption, and the catalyst electrochemical surface area is analyzed by the total amount of charges of hydrogen desorption:

$$ECSA = \frac{Q_{Cata.-H}}{\Gamma_{Cata.} \times L_{Cata.}}, \qquad (6)$$

where ECSA represents the catalyst electrochemical surface area, $\Gamma_{Cata.}$ represents an amount of charges required to cover the surface of the catalyst completely with a single layer of adsorption hydrogen, and $L_{Cata.}$ represents catalyst loading of a measured electrode;

when the formula (1) is used for an analysis, the real-time total amount of charges absorbed and desorbed on the surface of the catalyst in a full voltage range under all excitation conditions is solved reversely:

$$Q_{Cata.} = \int_0^t i_{ch} dt - i_H t - C_{dl}(U - U_0) - \frac{\int_0^t U dt}{R_e}; \qquad (7)$$

and when the formula (2) is used for an analysis, the real-time total amount of charges absorbed and desorbed on the surface of the catalyst in the full voltage range under all excitation conditions is solved reversely:

$$Q_{Cata.} = \int_0^t i_{ch} dt - i_H t - C_{dl}(U - U_0) \qquad (8),$$

it is checked whether $Q_{Cata.}$ meets a preset condition in the voltage window $[U_1, U_2]$; and if the preset condition is not met, the voltage window is adjusted and the analysis is repeated until the preset condition is met, the preset condition being that a standard deviation of all data of $Q_{Cata.}$ in the voltage window is smaller than a limit value.

7. The apparatus of claim 6, wherein
each of the plurality of voltage excitations is controlled as increasing a stack voltage of the fuel cell stack from a stable value to a limit value, the limit value of the stack voltage being determined based on a single fuel cell having a highest response voltage, and a response voltage being smaller than a safe voltage threshold; and each of the plurality of micro-current excitations comprises a constant current excitation and a non-constant current excitation, a end point of an excitation application of each of the plurality of micro-current excitations is determined based on a single fuel cell having a highest response voltage, a response voltage being smaller than a safe voltage threshold; when a high-precision power supply is used for an excitation at a programming current, the programming current is determined as an actually-measured current of the entire stack.

8. The apparatus of claim 6, wherein in a process of performing a plurality of excitations, the plurality of excitations is performed at a preset time interval, the preset time interval being determined based on that a voltage of each fuel cell falls to the concentration potential and is maintained for preset time after a previous excitation.

9. The apparatus of claim 6, wherein:
when the short-circuit resistance is greater than a preset resistance value, or when an influence of the short-circuit resistance is ignored for simplification processing, the excitation-response formula of the fuel cell is converted into:

$$\frac{\int_0^t i_{ch} dt}{t} = i_H + Q_{Cata.} \frac{1}{t} + C_{dl} \frac{U - U_0}{t}, \qquad \text{Formula (2)}$$

where $i_{ch}$ represents the real-time excitation current density, or the real-time response current density under the voltage excitation, $i_H$ represents the hydrogen cross-over current density, $Q_{Cata.}$ represents the real-time total amount of charges absorbed and desorbed on the surface of the catalyst, $C_{dl}$ represents the double-layer capacitance, U represents the real-time voltage of the single cell, $U_0$ represents the starting voltage of the single cell of the single excitation, and t represents the time.

* * * * *